United States Patent [19]
Huang et al.

[11] Patent Number: 6,069,066
[45] Date of Patent: May 30, 2000

[54] METHOD OF FORMING BONDING PAD

[75] Inventors: Yimin Huang, Taichung Hsien; Tri-Rung Yew, Hsinchu Hsien, both of Taiwan

[73] Assignee: United Microelectronics Corp., Hsinchu, Taiwan

[21] Appl. No.: 09/208,025

[22] Filed: Dec. 9, 1998

[51] Int. Cl.[7] .................................................. H01L 21/44
[52] U.S. Cl. ...................... 438/612; 438/653; 438/654; 438/656
[58] Field of Search ..................... 438/612, 652, 438/653, 654, 656, 685, 686, 687, 702; 228/180.5

[56] References Cited

U.S. PATENT DOCUMENTS

| | | | |
|---|---|---|---|
| 5,231,053 | 7/1993 | Bost | 438/627 |
| 5,785,236 | 7/1998 | Cheung | 228/180.5 |
| 5,918,149 | 6/1999 | Besser | 438/680 |
| 5,956,612 | 8/1999 | Elliott | 438/637 |

FOREIGN PATENT DOCUMENTS 87117229  10/1998  Taiwan .

OTHER PUBLICATIONS

Wolf, "Silicon Processing for the VLSI Era, vol. 2: Process Integration," p. 273–275, 1990.

*Primary Examiner*—Charles Bowers
*Assistant Examiner*—Nema Berezny
*Attorney, Agent, or Firm*—Oblon, Spivak, McClelland, Maier & Neustadt, P.C.

[57] ABSTRACT

A method of forming a bonding pad is provided. A substrate is provided and a multi-metal layer is formed on the substrate. An inter-metal dielectric layer with a trench is formed on the multi-metal layer. A conformal barrier layer is formed on the inter-metal dielectric layer. A first metal layer is formed on the barrier layer to fill a part of the trench. A second metal layer is formed on the first metal layer to fill the trench. A part of the first metal layer and a part of the second metal layer flowing out the trench are removed to expose the inter-metal dielectric layer. A cap layer is formed on the inter-metal dielectric layer. A passivation layer is formed on the cap layer. A part of the passivation and a part of the cap layer are removed to form a bonding pad window by a defined masking layer.

12 Claims, 4 Drawing Sheets

METHOD OF FORMING BONDING PAD

BACKGROUND OF THE INVENTION

1. Field of the Invention

The invention relates in general to a method of forming interconnections, and more particularly to a method of forming bonding pads.

2. Description of the Related Art

As the requirement on the complexity and precision of an integrated circuit design keeps increasing in order to reduce the feature size of a semiconductor device and increase the integration of an integrated circuit, a semiconductor device has to contain more than two metal layers to achieve the fabrication of high-density metal interconnects on a limited surface of a chip. As the design rules of a semiconductor device become finer and higher the requirements of lower resistivity and higher reliability increase, as well.

Since copper has better conductivity and reliability than aluminum, copper has become a new material used in the metal layers. During a conventional fabrication of interconnections, a copper pad is exposed in the air by a bonding pad window. The oxidation rate of copper is very high so that copper is easily oxidized to form copper oxide. That increases the resistance of the bonding pad and decreases semiconductor device reliability. Furthermore, the bonding pad adheres badly to a sweat joint with a welding line in the convention fabrication of interconnections. The yield of devices thus decreases from the bad adhesion.

FIGS. 1A to 1E are schematic, cross-sectional views showing a conventional process of forming a bonding pad. In FIG. 1A, a substrate 100 having a metal layer thereon is provided. An inter-metal dielectric layer 102 is formed on the substrate 100. A part of the inter-metal dielectric layer 102 is removed to form trenches 104, 105 and 106 therein.

In FIG. 1B, a conformal barrier layer 108 is formed on the inter-metal dielectric layer 102. A copper layer 110 is formed on the barrier layer 108 to fill the trenches 104, 105 and 106.

In FIG. 1C, a chemical-mechanical polishing process is performed to remove a part of the copper layer 110 until the inter-metal dielectric layer 102 is exposed. Copper lines 114, 115 and a copper pad 112 are formed within the trenches 104, 105 and 106.

In FIG. 1D, a cap layer 116 is formed on the inter-metal dielectric layer 102. A passivation layer 118 is formed on the cap layer 116. A defined photoresist layer 120 is formed on the passivation layer 118.

In FIG. 1E, a part of the passivation layer 118 and a part of the cap layer 116 are removed by the defined photoresist layer 120 to form a bonding pad window 122 and expose the copper pad 112. The photoresist layer 120 is removed.

According the process described above, since the bonding pad window 122 exposes the copper pad 112, the copper pad 112 is easily oxidized to form copper oxide. Resistance of the copper pad is thus increased to decrease device reliability. A welding line (not shown) is formed in the bonding pad window 122 to connect the copper pad 112. A preferred material of the welding line comprises gold. Since copper has bad adhesion with the welding line, a short occurs at the sweatjoint between the copper pad 112 and the welding line.

SUMMARY OF THE INVENTION

It is therefore an object of the invention to provide a method of forming a bonding pad without exposing the copper so that copper oxide is not formed. The short does not occur, which results in increased device reliability.

The invention achieves the above-identified objects by providing a method of forming a bonding pad. A substrate is provided. A multi-metal layer is formed on the substrate. An inter-metal dielectric layer with a trench is formed on the multi-metal layer. A conformal barrier layer is formed on the inter-metal dielectric layer. A first metal layer is formed on the barrier layer to fill a part of the trench. A second metal layer is formed on the first metal layer to fill the trench. A part of the first metal layer and a part of the second metal layer flowing out the trench are removed to expose the inter-metal dielectric layer. A cap layer is formed on the inter-metal dielectric layer. A passivation layer is formed on the cap layer. A part of the passivation and a part of the cap layer are removed to form a bonding-pad window by a defined masking layer.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
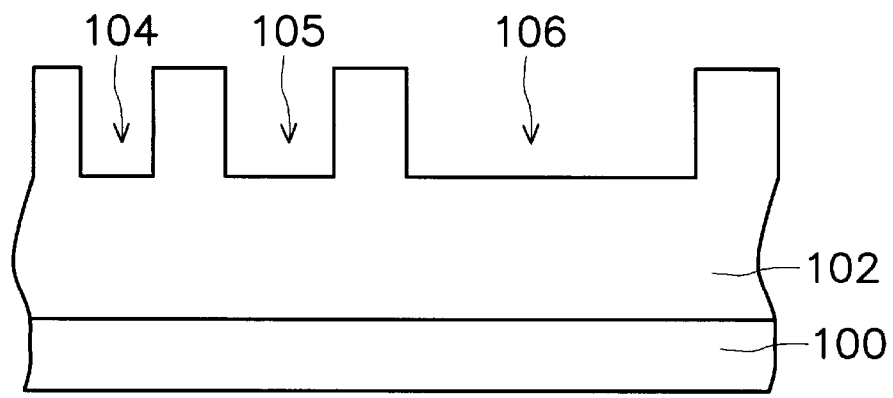
FIGS. 1A to 1E are schematic, cross-sectional views showing a conventional process of forming a bonding pad.
Figure 1B:
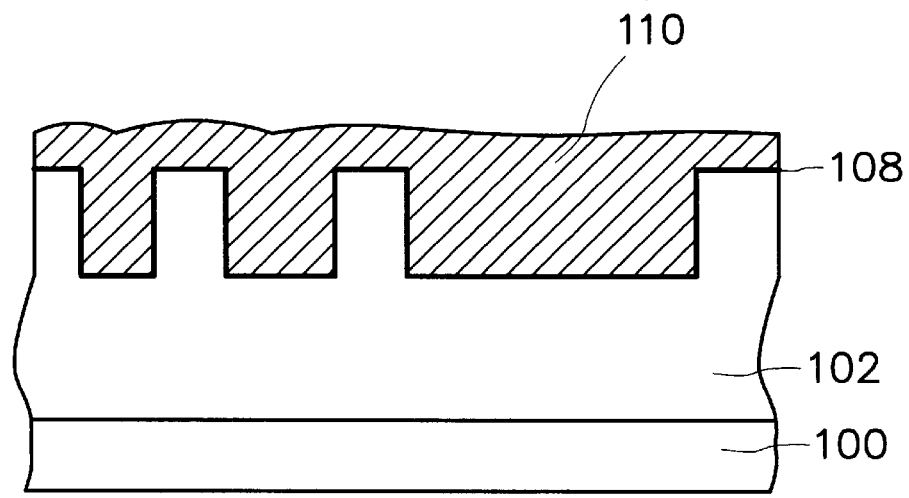
Figure 1C:
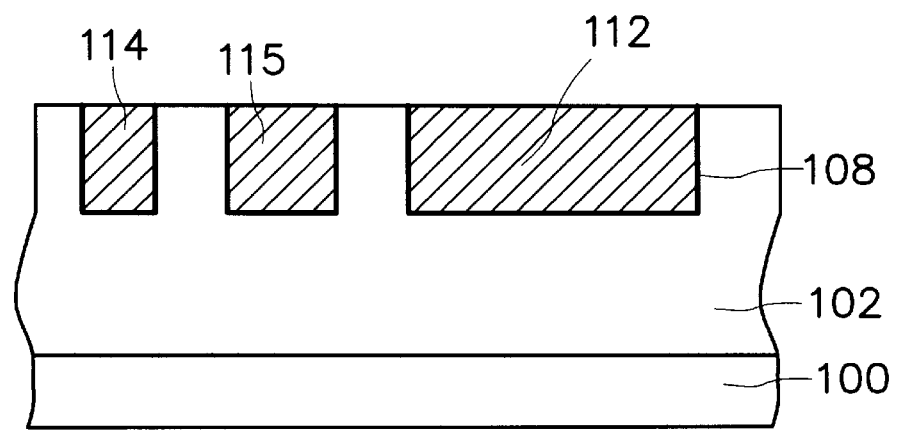
Figure 1D:
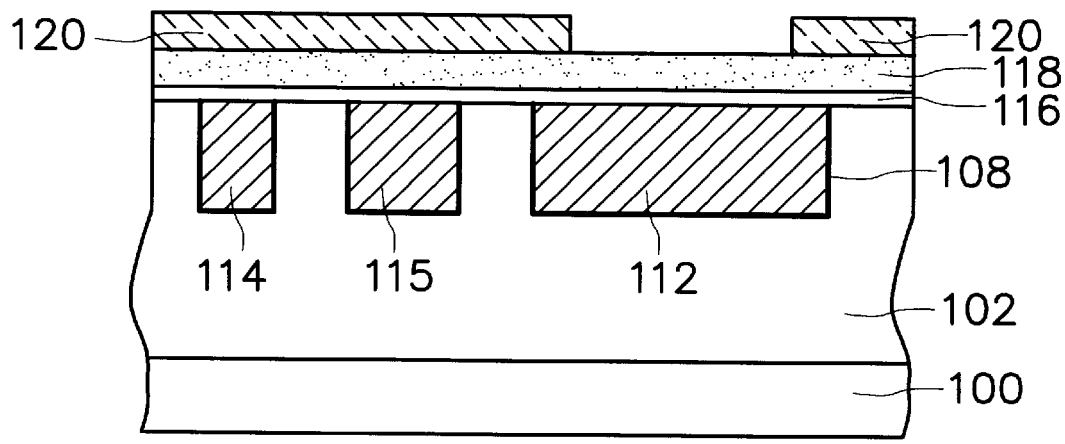
Figure 1E:
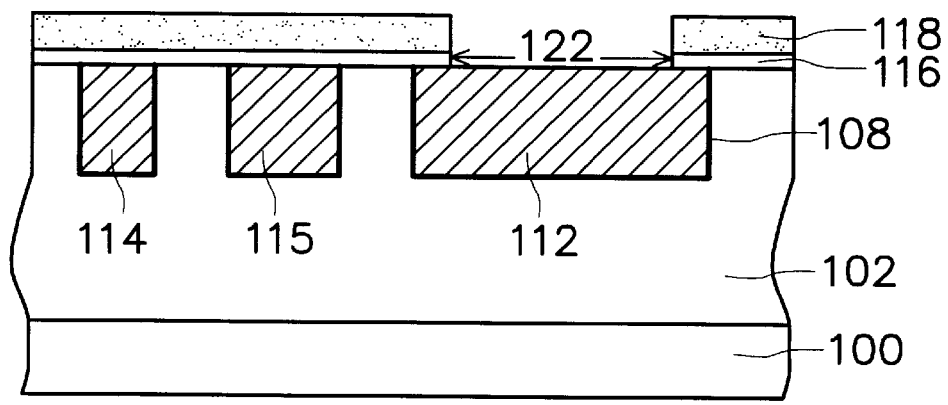
Figure 2A:
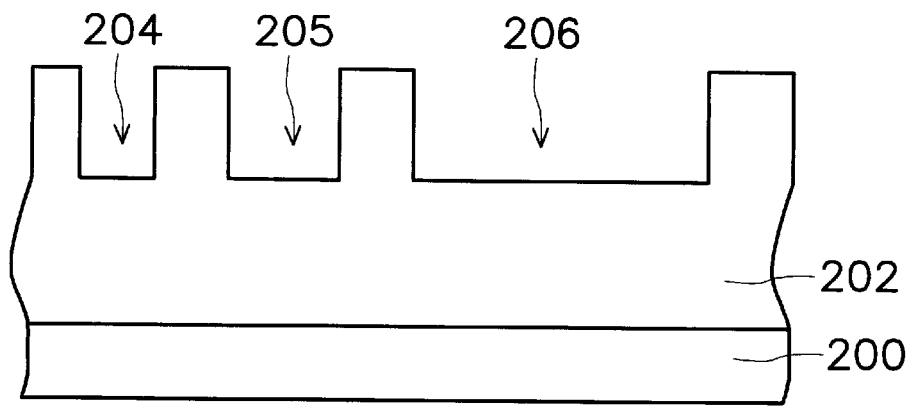
FIGS. 2A to 2F are schematic, cross-sectional views showing the process of one preferred embodiment of the method of forming a bonding pad.

In FIG. 2A, a substrate 200 is provided. The substrate 200 has a multi-metal layer (not shown) formed thereon. An inter-metal dielectric layer 202, such as a silicon oxide layer, is formed on the substrate 200, for example, by chemical vapor deposition (CVD). Trenches 204, 205, 206 are formed in the inter-metal dielectric layer 202.

Figure 2B:
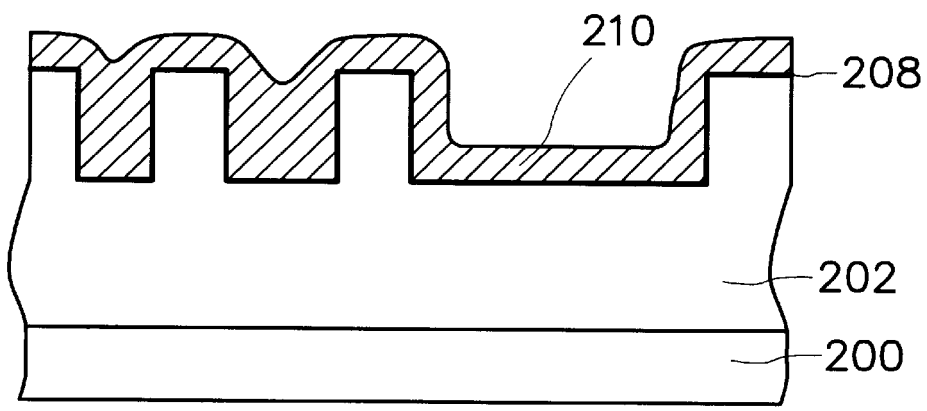

In FIG. 2B, a conformal barrier layer 208 is formed on the inter-metal dielectric layer 202. A first metal layer 210, such as a copper layer, is formed on the barrier layer 208 to fill partially the trenches 204, 205, 206. If a trench has a small width, such as the trench 204, the first metal layer 210 fills the whole trench. On the other hand, if a trench has a large width, such as the trench 205 or 206, the first metal layer 210 fills a part of the trench. A material of the barrier layer 208 comprises titanium/titanium nitride (Ti/TiN), titanium tungsten alloy (TiW), tantalum/tantalum nitride (Ta/TaN) or tungsten nitride (WN). A preferred method of forming the first metal layer 210 comprises sputtering, CVD or ionized-metal-plasma deposition.

Figure 2C:
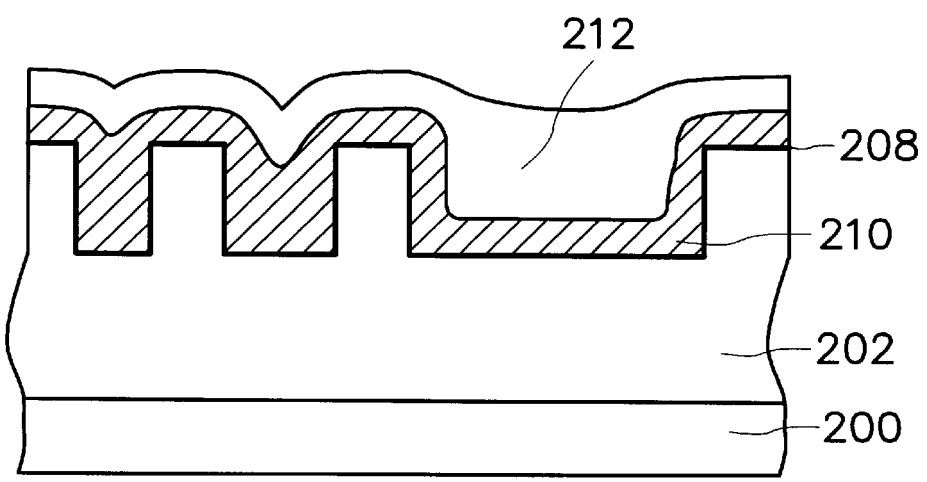

In FIG. 2C, a second metal layer 212 is formed on the first metal layer 210 to fill completely the trenches 204, 205, 206. A preferred material of the second metal layer comprises aluminum (Al), nickel (Ni) or gold (Au).

Figure 2D:
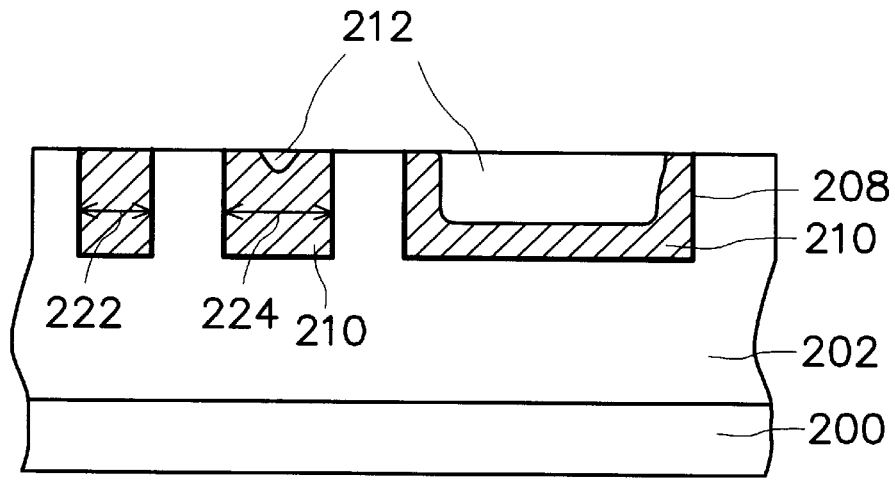

In FIG. 2D, a part of the second metal layer 212 and a part of the first metal layer 210 are removed until the inter-metal dielectric layer 202 is exposed, for example, by chemical-mechanical polishing (CMP).

Figure 2E:
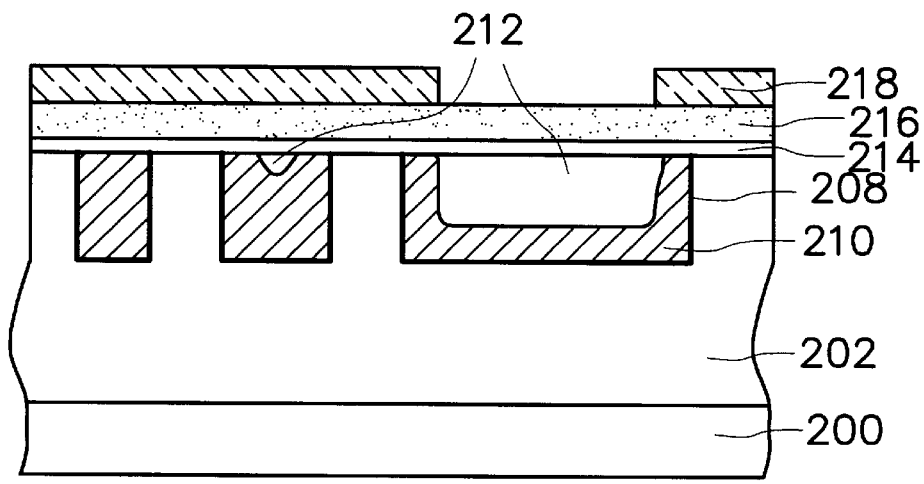

In FIG. 2E, a cap layer 214, such as a silicon nitride layer or a silicon-oxy-nitride layer is formed on the inter-metal dielectric layer 202. A passivation layer 216, such as a silicon nitride layer or a phosphosilicate glass (PSG) layer, is formed on the cap layer 214. The passivation layer 216 is formed, for example, by CVD. A defined masking layer 218, such as a photoresist layer, is formed on the passivation layer 216.

Figure 2F:
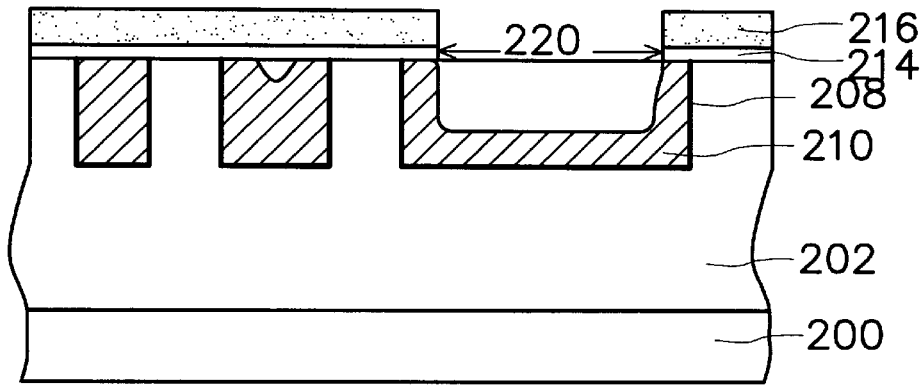

In FIG. 2F, a part of the passivation layer 216 and a part of the cap layer 214 are removed to expose the second metal layer 212 positioned in the trench 206, for example, by anisotropic etching according a pattern of the defined masking layer 218. A bonding pad window 220 is thus formed and exposes the second metal layer 212. The defined masking layer 218 is removed. A bonding pad consists of the second metal layer 212 and the first metal layer 210 remaining in the trench 206.

The second metal layer 212 covers the first metal layer 210. No copper of the first metal layer 210 is exposed by the bonding pas window 220, so no copper oxide is formed to increase the resistance of the bonding pad. A welding line, such as a gold line, is formed in the bonding pad window to connect to the bonding pad to attain an interconnection. Steps for forming the welding line are performed by a conventional technique; detailed description is therefore omitted. Since the adhesion between the welding line and the second metal layer 212 is good, a short between the bonding pad and the welding line formed in the bonding pad window 220 is prevented.

A feature of the invention is that a material exposed in the bonding pad window comprises aluminum (Al). nickel (Ni) or gold (Au). No copper oxide is formed to increase the resistance. Furthermore, a short does not occur at a sweat joint of the bonding pad.

Another feature of the invention is that adhesion of gold and aluminum, nickel or gold is good so that a short does not occur between the exposed bonding pad and the welding line.

Yet another feature of the invention is that a major part of the trenches are filled by the first metal layer, a copper layer, so the resistance and device reliability are not affected.

While the invention has been described by way of example and in terms of a preferred embodiment, it is to be understood that the invention is not limited thereto. To the contrary, it is intended to cover various modifications and similar arrangements and procedures and the scope of the appended claims therefore should be accorded the broadest interpretation so as to encompass all such modifications and similar arrangements and procedures.

What is claimed is:

1. A method of forming a bonding pad, comprising the steps of:

providing a substrate;

forming an inter-metal dielectric layer on the substrate, wherein the inter-metal dielectric layer has a trench therein;

forming a conformal barrier layer on the inter-metal dielectric layer;

forming a first metal layer on the conformal barrier layer to fill the trench partially;

forming a second metal layer on the first metal layer to fill the trench;

removing a part of the second metal layer and a part of the first metal layer simultaneously until the inter-metal dielectric layer is exposed;

forming a cap layer on the inter-metal dielectric layer;

forming a passivation layer on the cap layer; and removing a part of the passivation layer and a part of the cap layer to form a bonding pad window exposing the second metal layer positioned in the trench.

2. The method according to claim 1, wherein a material of the inter-metal dielectric layer comprises silicon nitride.

3. The method according to claim 1, wherein a material of the barrier layer is selected from a group consisting of titanium/titanium nitride, titanium tungsten alloy, tantalum/tantalum nitride and tungsten nitride.

4. The method according to claim 1, wherein the first metal layer comprises a copper layer.

5. The method according to claim 1, wherein a material of the second metal layer is selected from a group consisting of aluminum, nickel and gold.

6. The method according to claim 1, wherein a material of the cap layer is selected from a group consisting of silicon nitride and silicon-oxy-nitride.

7. The method according to claim 1, wherein a material of the passivation layer is selected from a group consisting of silicon nitride and phosphosilicate glass.

8. The method according to claim 1, wherein the step of removing a part of the second metal layer and a part of the first metal layer is performed by chemical-mechanical polishing.

9. The method according to claim 1, wherein the first metal layer is formed by chemical vapor deposition.

10. The method according to claim 1, wherein the first metal layer is formed by sputtering.

11. The method according to claim 1, wherein the first metal layer is formed by ionized-metal-plasma deposition.

12. The method according to claim 1, wherein the step of removing a part of the passivation layer and a part of the cap layer is performed by anisotropic etching.

* * * * *